(12) United States Patent
Sim et al.

(10) Patent No.: US 11,049,737 B2
(45) Date of Patent: Jun. 29, 2021

(54) APPARATUS AND METHOD FOR TREATING SUBSTRATE

(71) Applicant: SEMES CO., LTD., Chungcheongnam-do (KR)

(72) Inventors: Jinwoo Sim, Seoul (KR); Hyung Joon Kim, Gyeonggi-do (KR)

(73) Assignee: SEMES CO. LTD., Chungcheongnam-Do (KR)

( * ) Notice: Subject to any disclaimer, the term of this patent is extended or adjusted under 35 U.S.C. 154(b) by 172 days.

(21) Appl. No.: 16/166,614

(22) Filed: Oct. 22, 2018

(65) Prior Publication Data

US 2019/0131146 A1    May 2, 2019

(30) Foreign Application Priority Data

Oct. 26, 2017    (KR) ......................... 10-2017-0139992

(51) Int. Cl.
*H01L 21/67* (2006.01)
*H01J 37/00* (2006.01)

(52) U.S. Cl.
CPC ........ *H01L 21/67069* (2013.01); *H01J 37/00* (2013.01); *H01L 21/67103* (2013.01); *H01L 21/67126* (2013.01); *H01L 21/67248* (2013.01); *H01L 21/67109* (2013.01)

(58) Field of Classification Search
USPC ................................................ 118/719, 733
See application file for complete search history.

(56) References Cited

U.S. PATENT DOCUMENTS 5,044,311 A * 9/1991 Mase ................ H01J 37/32477
118/723 E
2013/0036970 A1 * 2/2013 Choi .................... C23C 16/4585
118/500

FOREIGN PATENT DOCUMENTS

| JP | H056800 A | 1/1993 |
|---|---|---|
| JP | 2001148378 A | 5/2001 |
| KR | 2007-0012070 | * 7/2005 |

(Continued)

OTHER PUBLICATIONS

Korean Office Action dated Jul. 8, 2020, for Corresponding Korean Application No. 10-2020-0051390.

*Primary Examiner* — Ram N Kacker

(74) *Attorney, Agent, or Firm* — Carter, DeLuca & Farrell LLP

(57) ABSTRACT

Disclosed is An apparatus for treating a substrate includes a chamber having a treatment space provided therein to treat the substrate and having an entrance for introducing or withdrawing the substrate, a liner disposed in the treatment space, disposed adjacent to an inner sidewall of the chamber, and having an opening formed at a position of facing the entrance to introduce or withdraw the substrate, a supporting unit to support the substrate in the treatment space, a gas supplying unit to supply process gas to the treatment space, a plasma source to produce plasma from the process gas, and a door assembly to open or close the entrance. The door assembly includes a door which includes a door unit provided outside the chamber to be movable between an opening position to open the entrance and a closing position to close the entrance, and an insertion unit extending from the door unit toward the treatment space and inserted into the opening of the liner at the closing position, and a door driving unit to drive the door.

6 Claims, 4 Drawing Sheets

(56) References Cited

FOREIGN PATENT DOCUMENTS

| KR | 20070004305 A | | 1/2007 | | |
|----|---------------|---|--------|---|---|
| KR | 20070012070 A | | 1/2007 | | |
| KR | 100682216 B1 | | 2/2007 | | |
| KR | 100822462 | * | 4/2008 | ......... | H01L 21/3065 |
| KR | 2012-0077100 | * | 12/2010 | | |
| KR | 20110049621 A | | 5/2011 | | |
| KR | 20120077100 A | | 7/2012 | | |
| KR | 20130099776 A | | 9/2013 | | |
| KR | 2015-0076800 | * | 12/2013 | | |
| KR | 20130138474 A | | 12/2013 | | |
| KR | 20150076800 A | | 7/2015 | | |

* cited by examiner

APPARATUS AND METHOD FOR TREATING SUBSTRATE

CROSS-REFERENCE TO RELATED APPLICATIONS

This application claims priority under 35 U.S.C. § 119 to Korean Patent Application No. 10-2017-0139992 filed on Oct. 26, 2017, in the Korean Intellectual Property Office, the disclosures of which are incorporated by reference herein in their entireties.

BACKGROUND

Embodiments of the inventive concept described herein relate to an apparatus and a method for treating a substrate. More particularly, embodiments of the inventive concept described herein relate to an apparatus and a method for treating a substrate, capable of opening/closing an entrance of a chamber and an opening of a liner.

In general, the fabricating process of a semiconductor device includes various processes of treating a substrate using plasma. The processes include an etching process, a deposition process, and a cleaning process.

The entrance and the opening are formed in the chamber and the liner, respectively, to supply the substrate to an electrostatic chuck positioned inside the chamber before the process is performed. In addition, a door assembly is provided to open/close the entrance to isolate the chamber from the outside. However, conventionally, even if the entrance is closed by the door assembly, a treatment space of the chamber is not completely sealed from the outside.

SUMMARY

Embodiments of the inventive concept provide an apparatus and a method for treating a substrate, capable of simultaneously opening/closing an entrance of a chamber and an opening of a liner by using a door having a door unit and an insertion unit.

The technical objects of the inventive concept are not limited to the above-mentioned ones, and the other unmentioned technical objects will become apparent to those skilled in the art from the following description.

According to an exemplary embodiment, an apparatus for treating a substrate includes a chamber having a treatment space provided therein to treat the substrate and having an entrance for introducing or withdrawing the substrate, a liner disposed in the treatment space, disposed adjacent to an inner sidewall of the chamber, and having an opening formed at a position of facing the entrance to introduce or withdraw the substrate, a supporting unit to support the substrate in the treatment space, a gas supplying unit to supply process gas to the treatment space, a plasma source to produce plasma from the process gas, and a door assembly to open or close the entrance. The door assembly includes a door which includes a door unit provided outside the chamber to be movable between an opening position to open the entrance and a closing position to close the entrance, and an insertion unit extending from the door unit toward the treatment space and inserted into the opening of the liner at the closing position, and a door driving unit to drive the door.

In this case, the door may further include a heating member provided inside the door.

In this case, the heating member may be provided to extend from the door unit to the insertion unit.

Further, the door may be provided such that an inner side surface of the liner is aligned in a line with an end surface of the insertion unit, at the closing position.

In this case, the door may include a bonding member provided at a position allowing the door unit to make contact with the liner when the door is at the closing position.

In this case, the bonding member may include a conductive gasket.

Further, a region of the insertion unit of the door exposed to the treatment space may be coated with an insulated film, when the door is in the closing position.

As described above, according to various embodiments of the inventive concept, the entrance of the chamber and the opening of the liner are simultaneously open/closed by using the door, thereby completely sealing the treatment space of the chamber from the outside. In addition, the entire region of the liner may be connected in terms of heat transfer and grounding.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
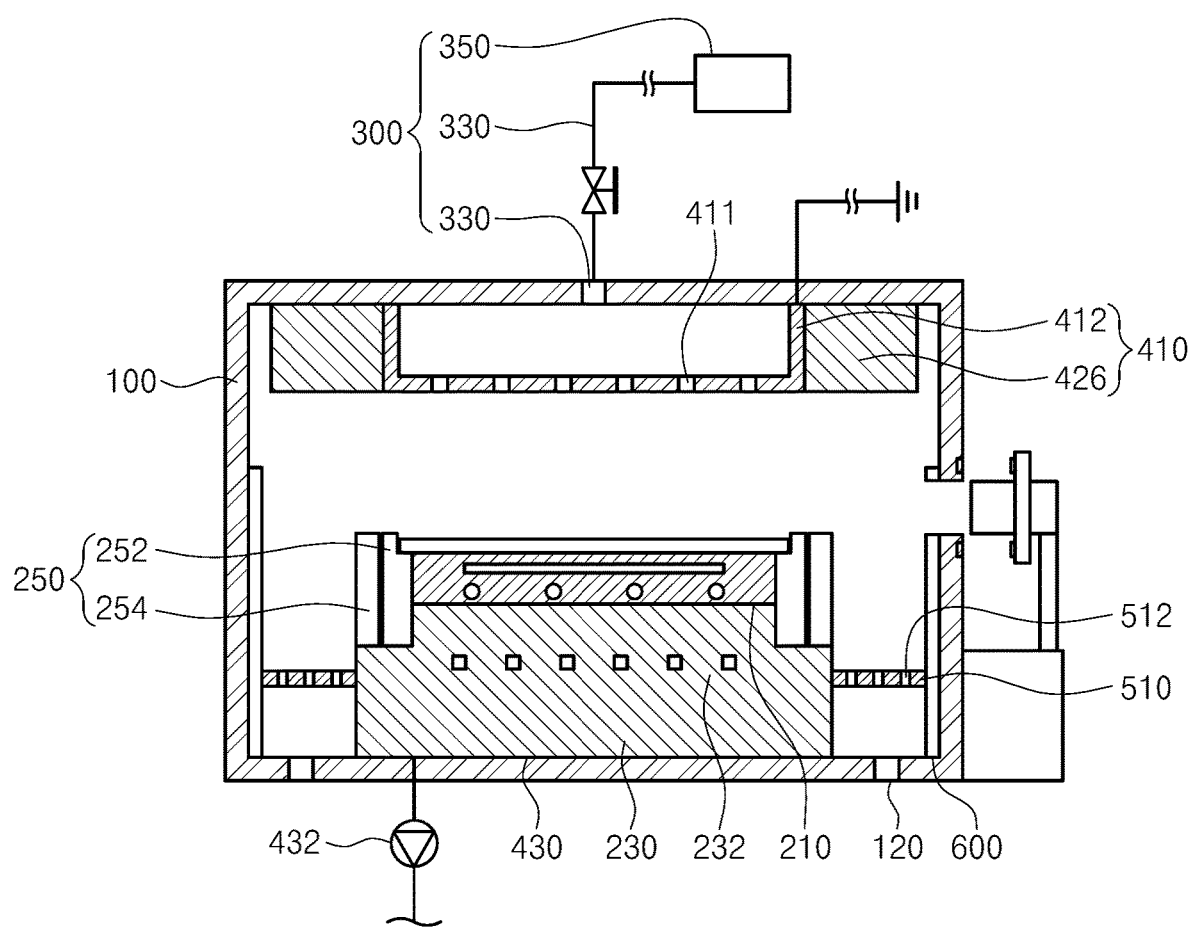
FIG. 1 is a sectional view illustrating an apparatus for treating a substrate, according to an embodiment of the inventive concept.

The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

The embodiment of the inventive concept will be described regarding an apparatus and a method for treating a substrate, capable of etching the substrate by using plasma. However, the inventive concept is not limited thereto, but is applicable to various types of devices and methods capable of performing the process using the plasma.

FIG. 1 is a sectional view illustrating an apparatus for treating a substrate, according to an embodiment of the inventive concept.

Referring to FIG. 1, an apparatus 10 for treating a substrate (hereinafter, referred to as "a substrate treating apparatus 10") includes a chamber 100, a supporting unit 200, a gas supplying unit 300, a plasma source 400, a baffle unit 500, and a liner 600.

The chamber 100 provides a space in which a process is performed. The chamber 100 may have the cylindrical shape and may be formed of a metal material. An exhaust hole 120 is formed in the floor of the chamber body 100. The exhaust hole 120 is connected with an exhaust line on which a pump 140 is mounted. The pump 140 provides vacuum pressure to an inner part of the chamber 100 through the exhaust line.

A process byproduct produced while the process is performed and process gas staying inside the chamber 100 are discharged out of the chamber 100 through the exhaust hole 120. In addition, the internal pressure of the chamber 100 is reduced to specific pressure through the exhaust hole 120. An entrance 160 is formed in one sidewall of the chamber 100. The entrance 160 serves as a passage for introducing into the chamber 100 or withdrawing out of the chamber 100. The entrance 160 may be open/closed by the door assembly provided on the outer sidewall of the chamber 100. The door assembly includes a door 180 to open/close the entrance 160 of the chamber 100 and a door driving unit 190 to drive the door 180. The door driving unit 190 may move the door 180 in a vertical direction or horizontal direction with respect to the chamber 100. In other words, when opening the door 180, the door driving unit 190 may move the door 180 apart from the chamber 100 in the horizontal direction and then may move the door 180 downward in the vertical direction. In addition, when closing the door 180, the door driving unit 190 may move the door 180 upward in the vertical and then may move the door 180 toward the chamber 100 in the horizontal direction. For example, the door driving unit 190 may include a motor and a connection member to connect the motor with the door 180. As the motor is driven, the connection member is moved in the vertical direction or the horizontal direction. Accordingly, the door driving unit 190 may move the door 180 in the vertical direction or the horizontal direction with respect to the chamber 100.

The door 180 includes a door unit disposed outside the chamber 100 to be movable between an opening position that opens the entrance 160 and a closing position that closes the entrance 160, and an insertion unit extending toward the treatment space of the chamber 100 from the door. The detailed structure of the door 180 will be described later with reference to FIGS. 2 to 4.

The supporting unit 200 supports the substrate W inside the chamber 100. The supporting unit 200 may include an electrostatic chuck to suck the substrate W by electrostatic force. Alternatively, the supporting unit 200 may support the substrate W in various manners such as mechanical clamping.

The supporting unit 200 includes a dielectric plate 210, a ring assembly 250, and a base 230.

The substrate "W" is placed on the dielectric plate 210. The dielectric plate 210 is provided in a disc shape. A heater 212 is installed inside the dielectric plate 210 to heat the substrate W. The heater 212 maintains the substrate W to be at a process temperature during the process. The heater 212 may be provided in the form of a coil having the shape of a spiral.

The ring assembly 250 has a focus ring 252 and an edge ring 254. The focus ring 252 focuses on the substrate W by using plasma. The focus ring 252 is provided to surround the dielectric plate 210. The focus ring 252 is provided in the shape of a circular ring. The focus ring 252 has a stepped shape such that an outer portion of the top surface of the focus ring 252 is higher than an inner portion of the top surface of the focus ring 252. The inner portion of the top surface of the focus ring 252 supports an edge of the bottom surface of the substrate W. The outer portion of the top surface of the focus ring 252 is provided to surround a side portion of the substrate W. The edge ring 254 is provided to surround the focus ring 252.

The base 230 supports the dielectric plate 210. The base 230 is positioned under the dielectric plate 210 and is fixedly coupled to the dielectric plate 210. The top surface of the base 230 is stepped such that the center of the top surface is higher than the edge of the top surface. The center of the top surface of the base 230 has the size corresponding to the bottom surface of the dielectric plate 210. A cooling passage 232 is formed in the base 230. The cooling passage 232 serves as a passage that a cooling fluid circulates. The cooling fluid may maintain the substrate W to be at the process temperature while flowing through the cooling passage 232. The cooling passage 232 may be provided in the spiral shape inside the base 230. Alternatively, the cooling passage 232 may be provided in the dielectric plate 210.

A gas supplying unit 300 supplies the process gas into the chamber 100. The gas supplying unit 300 includes a gas storage 350, a gas supply line 330, and a gas inlet port 310. The gas supply line 330 links the gas storage 350 with the gas inlet port 310. The process gas contained in the storage 350 is supplied to the gas inlet port 310 through the gas supply line 330. A valve is installed on the gas supply line 330 to open/close the passage thereof or may adjust an amount of gas flowing through the passage.

The plasma source 400 excites the process gas, which stays inside the chamber 100, to be in a plasma state. The plasma source 400 forms the inner space of the chamber 100 as a discharge space. The plasma source 400 may include a capacitive coupled plasma source.

The plasma source 400 includes an upper electrode 410, a lower electrode 430, and a power source 432. The upper electrode 410 is opposite to the lower electrode 430 in the vertical direction.

The upper electrode 410 includes a shower head 412 and a ring member 426. The shower head 412 is opposite to the dielectric plate 210 and has a diameter greater than a diameter of the dielectric plate 210. The shower head 412 is positioned under the gas inlet port 310. The shower head 412 receives the process gas through the gas inlet port 310. Spray holes 411 are formed in the bottom surface of the shower head 412 to spray the process gas. The ring member 426 is provided to surround an outer circumference of the shower head 412. The ring member 426 is electrically connected with the shower head 412 in contact with the shower head 412. The lower electrode 430 is provided inside the dielectric plate 210. The lower electrode 430 is positioned above the heater 212. The upper electrode 410 is grounded and the power source 432 is connected with the lower electrode 430. Accordingly, when high-frequency power is applied to the lower electrode 430 from the power source 432, a discharge space is formed between the upper electrode 410 and the lower electrode 430. The process gas staying inside the discharge space may be excited to be in a plasma state.

Through holes 512 are formed through the baffle unit 500 such that the process gas staying in the chamber 100 is discharged through the exhaust hole 120. The liner 600 has the diameter corresponding to the inner sidewall of the chamber 100, thereby preventing the inner sidewall of the chamber 100 from being damaged during the process of exciting the process gas. In addition, an entrance 610 is formed inside the liner 600 such that the substrate W is introduced or withdrawn.

Figure 2:
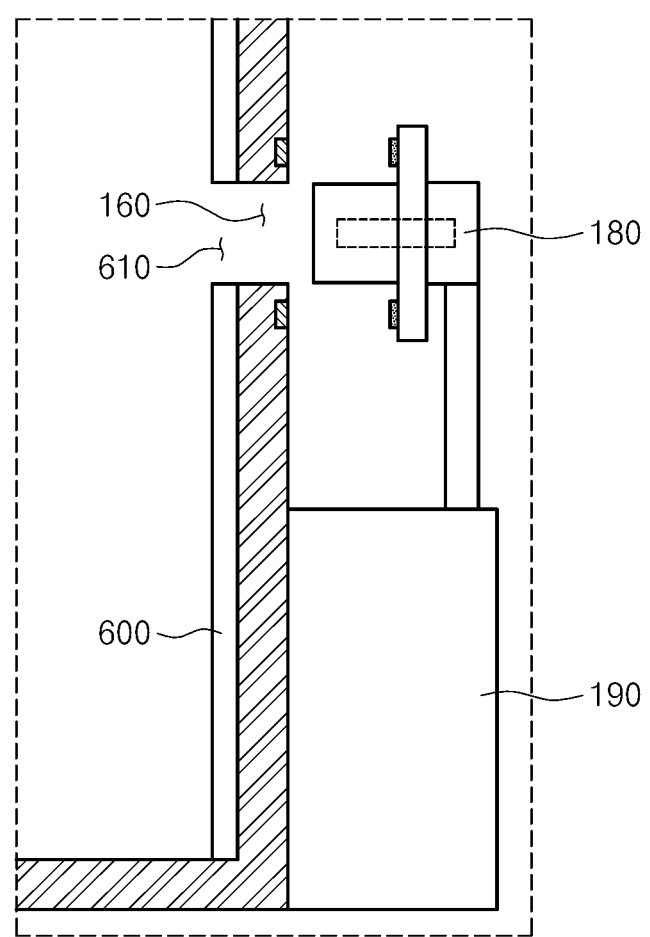
FIGS. 2 and 3 are views illustrating the operation of a door assembly, according to an embodiment of the inventive concept.
Figure 3:
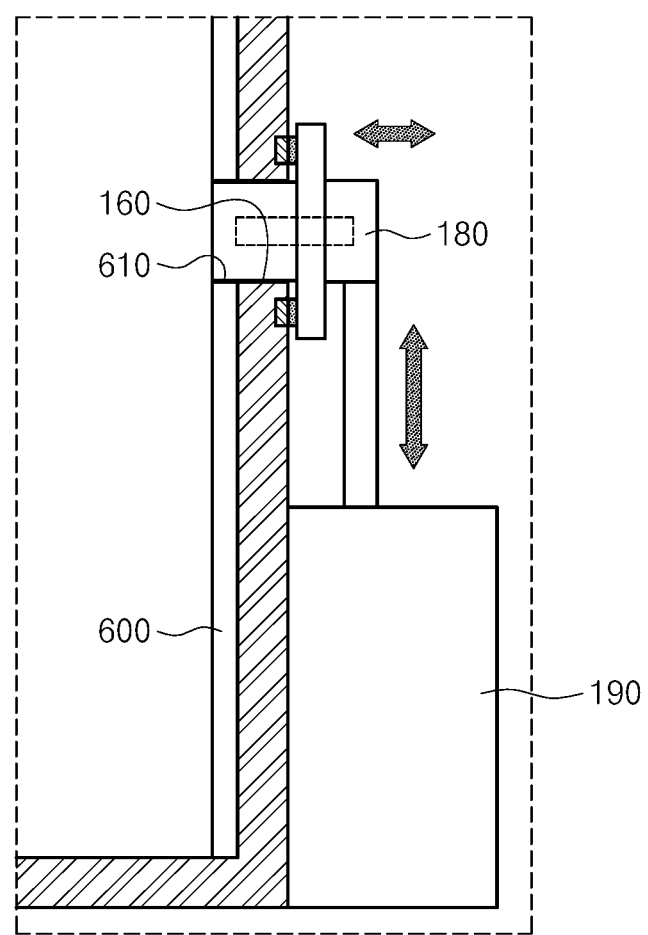
Figure 4:
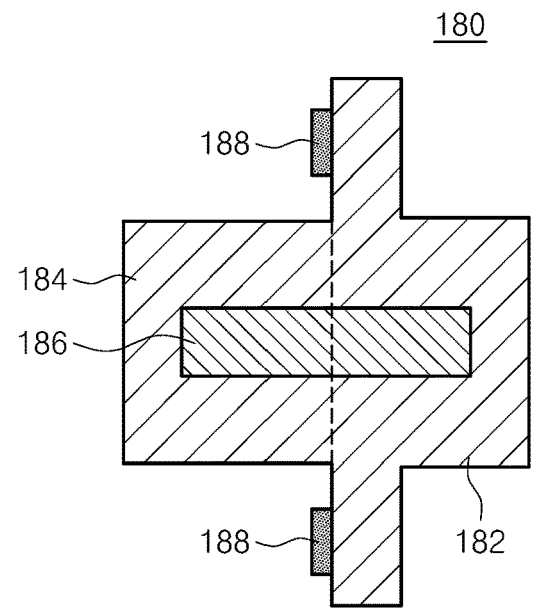
FIGS. 4 and 5 are views illustrating the detailed components of the door, according to an embodiment of the inventive concept.

FIGS. 2 and 3 are views illustrating the operation of the door assembly, according to an embodiment of the inventive concept.

Figure 5:
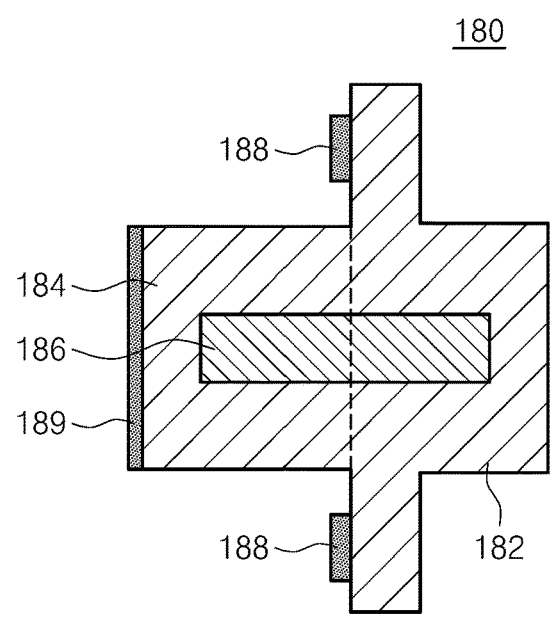

The door 180 may move between the opening position and the closing position by the door driving unit 190. When the door 180 moves to the closing position, the inner surface of the liner 600 is aligned in line with an end surface of the door 180. Accordingly, the opening 610 of the liner 600 is connected with the end surface of the door 180, so the entire region of the liner 600 may be electrically or thermally connected. In other words, as illustrated in FIG. 5, the door 180 may include a door unit 182 provided outside the chamber 100 to be movable between an opening position to open the entrance 160 and a closing position to close the entrance 160, and an insertion unit 184 extending from the door unit 182 toward the treatment space of the chamber 100 and inserted into the opening 610 of the liner 600 at the closing position. The insertion unit 184 closes the opening 610 of the liner 600 while the end surface of the insertion unit 184 is aligned in line with the inner surface of the liner 600.

In addition, the door 180 includes the heating member 186 provided inside the door 180. The heating member 186 is provided to extend from the door unit 182 to the insertion unit 184 such that the temperature is uniformly controlled in the entire region of the door 180. The door 180 may be controlled by the heating member 186 at the same temperature as that of the liner 600. Accordingly, the temperature may be identically provided in the entire region of the liner 600.

In addition, when the door 180 is positioned in the closing position, the door 180 may have bonding members 187 and 188 provided at positions thereof that the door unit 182 makes contact with the outer portion of the liner 600. In detail, the bonding members 187 and 188 may be provided at the outer portion of the liner 600 and the door unit 182. When the door 180 is at the closing position, the bonding member 187 provided at the outer portion of the liner 600 may be coupled to the bonding member 188 provided at the door unit 182. As the contact parts between the door 180 and the liner 600 are completely coupled to each other by the bonding members 187 and 188, when the door 180 is positioned at the closing position, the treatment space of the chamber 100 may be perfectly seated from the outside. For example, the bonding members 187 and 188 may include conductive gaskets and thus the bonding members 187 and 188 may be prevented from being corroded by plasma produced in the treatment space.

In addition, as illustrated in FIG. 5, in the door 180, the region of the insertion unit 184 which is exposed to the treatment space of the chamber 100 may be coated with the insulating film. Accordingly, when plasma is excited in the treatment space of the chamber 100, the end surface of the insertion unit 184 is prevented from being corroded.

As described above, according to various embodiments of the inventive concept, the entrance of the chamber and the opening of the liner are simultaneously open/closed by using the door, thereby completely sealing the treatment space of the chamber from the outside. In addition, the entire region of the liner may be connected in terms of heat transfer and grounding Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims. Therefore, embodiments of the present disclosure are not intended to limit the technical spirit of the present disclosure, but provided only for the illustrative purpose. The scope of protection of the present disclosure should be construed by the attached claims, and all equivalents thereof should be construed as being included within the scope of the present disclosure.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. An apparatus for treating a substrate, the apparatus comprising:
    a chamber having a treatment space provided therein to treat the substrate and having an entrance for introducing or withdrawing the substrate;
    a liner disposed in the treatment space, disposed adjacent to an inner sidewall of the chamber, and having an opening formed at a position, facing the entrance;
    a supporting unit to support the substrate in the treatment space;
    a gas supplying unit to supply process gas to the treatment space;
    a plasma source to produce plasma from the process gas; and
    a door assembly to open or close the entrance,
    wherein the door assembly includes:
        a door which includes a door unit provided outside the chamber to be movable between an opening position to open the entrance and a closing position to close the entrance;
        an insertion unit extending from the door unit toward the treatment space and inserted into the entrance and the opening of the liner at the closing position; and
        a door driving unit to drive the door,
    wherein the entrance is a through opening between the inner sidewall and an outer sidewall of the chamber,
    wherein the chamber includes a first bonding member installed around the entrance at an outside of the chamber,
    wherein the door includes a second bonding member, and
    wherein, when the door assembly is at the closing position, the second bonding member of the door contacts the first bonding member of the chamber and an outermost sidewall of the insertion unit is aligned with the inner sidewall of the chamber.

2. The apparatus of claim 1, wherein the door further includes:
    a heating member provided inside the door.

3. The apparatus of claim 2, wherein the heating member is provided to extend from the door unit to the insertion unit.

4. The apparatus of claim 1, wherein an inner side surface of the liner is in line with the outermost sidewall of the insertion unit, at the closing position.

5. The apparatus of claim 1, wherein the bonding member includes a conductive gasket.

6. The apparatus of claim 1, wherein the outermost sidewall of the insertion unit of the door assembly exposed to the treatment space is coated with an insulated film.

* * * * *